United States Patent
Kang (10) Patent No.: US 8,477,533 B2
(45) Date of Patent: *Jul. 2, 2013

(54) OVER-SAMPLING READ OPERATION FOR A FLASH MEMORY DEVICE

(75) Inventor: Dong-Ku Kang, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/402,922

(22) Filed: Feb. 23, 2012

(65) Prior Publication Data

US 2012/0147671 A1    Jun. 14, 2012

Related U.S. Application Data

(63) Continuation of application No. 12/034,872, filed on Feb. 21, 2008, now Pat. No. 8,149,618.

(30) Foreign Application Priority Data

Feb. 27, 2007    (KR) .................. 10-2007-0019804

(51) Int. Cl.
    *G11C 16/04*    (2006.01)
(52) U.S. Cl.
    USPC ............ 365/185.03; 365/185.22; 365/185.18; 365/185.24
(58) Field of Classification Search
    USPC   365/185.03, 185.22, 185.24, 185.17–185.19, 365/185.33
    See application file for complete search history.

(56) References Cited

U.S. PATENT DOCUMENTS

| 6,768,673 | B1* | 7/2004 | Hsia et al. ................ 365/185.03 |
| 6,816,409 | B2 | 11/2004 | Tanaka |
| 7,023,735 | B2 | 4/2006 | Ban et al. |
| 7,526,715 | B2 | 4/2009 | Litsyn et al. |
| 7,542,350 | B2* | 6/2009 | Park et al. ................ 365/185.24 |
| 7,652,918 | B2 | 1/2010 | Wan et al. |
| 7,681,109 | B2 | 3/2010 | Litsyn et al. |
| 8,149,618 | B2* | 4/2012 | Kang ....................... 365/185.03 |

FOREIGN PATENT DOCUMENTS

| JP | 10092186 | 4/1998 |
| JP | 2003297099 A | 10/2003 |
| JP | 2004103089 | 4/2004 |
| KR | 1020020057055 A | 7/2002 |
| KR | 1020020072628 A | 9/2002 |
| KR | 1020040022409 A | 3/2004 |
| KR | 1020060025172 A | 3/2006 |

* cited by examiner

*Primary Examiner* — David Lam
(74) *Attorney, Agent, or Firm* — Volentine & Whitt, PLLC (57) ABSTRACT

A flash memory device and a reading method are provided where memory cells are divided into at least two groups. Memory cells are selected according to a threshold voltage distribution. Data stored in the selected memory cells are detected and the data is latched corresponding to one of the at least two groups according to a first read operation. A second read operation detects and latches data of the memory cells corresponding to another one of the at least two groups. The data is processed through a soft decision algorithm during the second read operation.

16 Claims, 8 Drawing Sheets

OVER-SAMPLING READ OPERATION FOR A FLASH MEMORY DEVICE

CROSS-REFERENCE TO RELATED APPLICATIONS

This application is a Continuation Application of application Ser. No. 12/034,872, filed Feb. 21, 2008, Now U.S. Pat. No. 8,149,618, which claims the benefit of Korean Patent Application No. 10-2007-0019804, filed on Feb. 27, 2007 in the Korean Intellectual Property Office, the disclosure of which is incorporated herein in its entirety by reference.

BACKGROUND OF THE INVENTION

1. Field of the Invention

Embodiments of the invention relate to a semiconductor memory device. More particularly, embodiments of the invention relate to a flash memory device configured to perform an over-sampling read operation on a memory cell and an associated read method.

2. Discussion of Related Art

Semiconductor memory devices are largely classified into volatile and non-volatile semiconductor memory devices. Volatile semiconductor memory devices are characterized by fast reading and writing speeds, but the stored contents disappear when no external power is applied. Non-volatile semiconductor memory devices retain their stored contents even when no power is applied. Therefore, the non-volatile semiconductor memory devices are used to store vital contents, which must remain regardless of power supplied to the device. Examples of non-volatile semiconductor memory devices include, for example, mask read-only memory (MROM), programmable read-only memory (PROM), erasable programmable read-only memory (EPROM), and electrically erasable programmable read-only memory (EEPROM).

Since erase and write operations are relatively complicated in MROM, PROM, and EPROM devices, memory contents may not be able to be updated. Since erase and write operations can be electrically done in EEPROM devices, these devices are more commonly used in system programming or auxiliary memory device applications which require continuous updating. Flash EEPROM devices have a higher degree of system integration compared to a typical EEPROM device because of its high-capacity memory applications. A NAND-type flash EEPROM (hereinafter, referred to as a NAND flash memory) has a remarkably higher degree of systems integration compared to other flash EEPROM.

As demands for memory devices increase, multi-bit memory storage devices that store multi-bit data in one memory cell are actively under development. When storing 1-bit data in a memory cell, the memory cell has two threshold voltage distributions; one voltage threshold corresponds to a data 1 and the other voltage threshold corresponds to a data 0. However, when storing 2-bit data in a single memory cell, the cell is programmed with one of four threshold voltage distributions. Additionally, when storing 3-bit data in a single memory cell, a memory cell is programmed with one of eight threshold voltage distributions. Recently, various technologies for storing 4-bit data on one memory cell are actively under development.

Figure 1A:
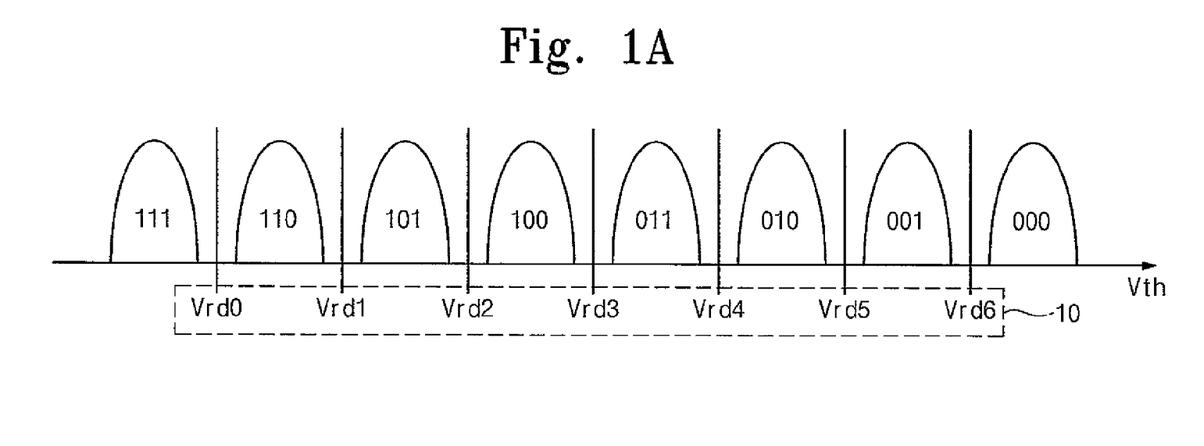
FIG. 1A is a view of a normal read voltage of a typical multi-bit memory cell.

FIG. 1A is a diagram illustrating a normal read operation of a typical multi-bit memory cell where read voltages 10 are used to read multi-bit data in a memory cell allocated between threshold voltage distributions corresponding to 3-bit data (i.e., '111', '110', '101', . . . , '001', '000'), respectively. Read voltage Vrd3 is applied to a word line of a memory cell to read data of a most significant bit (MSB) page (e.g., a first page) of 3-bit data. A read voltage Vrd1 or Vrd5 is applied to read data of a second page between the MSB page and a least significant bit (LSB) page (e.g., a third page). Lastly, read voltages Vrd0, Vrd2, Vrd4, and Vrd6 are applied to a word line of memory cells to read data of the LSB page.

Accurate control of a program voltage Vpgm and a verify voltage Vvfy is essential to storing multi-bit data in one memory cell. Each interval between threshold voltage distributions in memory cells can be densely controlled by an accurate voltage control. In particular, a step size of a program voltage can be reduced for dense threshold voltage distributions. However, this drastically decreases program speed. Otherwise, threshold voltage distributions of memory cells can be formed in a broader voltage range. A high voltage pump is required to accommodate this broader voltage range which in turn, increases device costs. Attempts to resolve the above limitations are typically targeted at the read operation rather than the program operation. One attempt focuses on an over-sampling read operation or a fractional read operation through a maximum likelihood method. The over-sampling read operation utilizes a relative interval from a reference value of the threshold voltage distribution (e.g., a middle value of threshold voltage distribution).

Figure 1B:
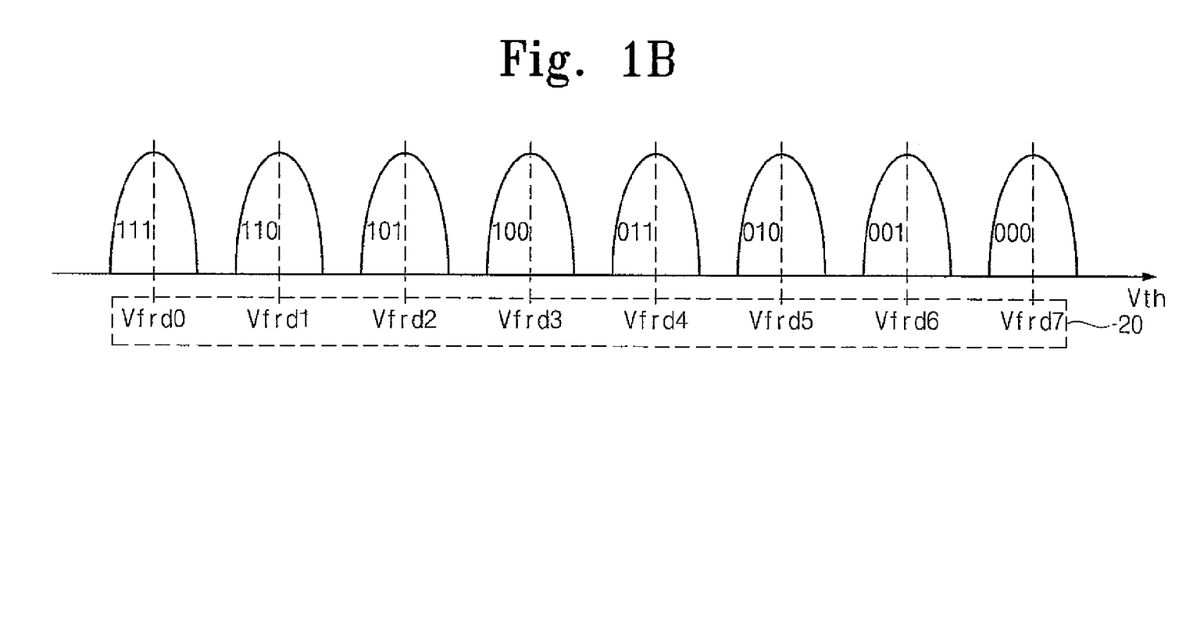
FIG. 1B is a view of an over-sampling read voltage of a typical multi-bit memory cell.

FIG. 1B is a diagram illustrating an over-sampling read operation of a multi-bit memory cell. Over-sampling read voltages Vfrd0 to Vfrd7 are set within each threshold voltage distribution not between threshold voltage distributions as illustrated in FIG. 1A. An over-sampling voltage is applied to perform an over-sampling read operation one time with respect to one threshold voltage distribution. Accordingly, the respective over-sampling read voltages Vfrd0 to Vfrd7 are set with middle values (or, average values) of corresponding threshold voltage distributions. However, when performing an over-sampling read operation two or three times with respect to one threshold voltage distribution, over-sampling read voltages are set with values that equally divide one threshold voltage distribution into a plurality of units.

By using the above normal read operation and the over-sampling read operation, a read operation can be performed using a relative interval from a reference value of threshold voltage distribution (e.g., an average value of distribution). Technologies for an over-sampling read or fractional read operation are disclosed in U.S. Pat. No. 7,023,735, titled "METHODS OF INCREASING THE RELIABILITY OF A FLASH MEMORY" and U.S. Pat. No. 6,816,409, titled "NON-VOLATILE SEMICONDUCTOR MEMORY DEVICE AND REWRITING METHOD", which are incorporated by reference.

Presently, there are no specific devices or methods for externally outputting over-sampling data from memory device. In addition, there is no effective method of outputting data which are detected according to a normal reading operation and an over-sampling read operation. Accordingly, a data reading method of a flash memory device is required to output data at high speed which are detected according to an over-sampling read operation.

SUMMARY OF THE INVENTION

Exemplary embodiments of the present invention are directed to a memory device. In an exemplary embodiment a method of reading memory cells of a flash memory device includes dividing memory cells in the flash memory device into at least two groups. Particular memory cells are selected according to a threshold voltage distribution. The data stored in the selected memory cells are detected and latched corresponding to one of the at least two memory cell groups according to a first read operation. The data of memory cells corresponding to another of the at least two groups according to a second read operation are detected and latched. The data detected and latched according to the first read operation is processed through a soft decision algorithm during the process of detecting and latching of the data according to the second read operation.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Although a NAND flash memory device is used as an example herein, those skilled in the art will appreciate that alternative embodiments may be employed.

Figure 2:
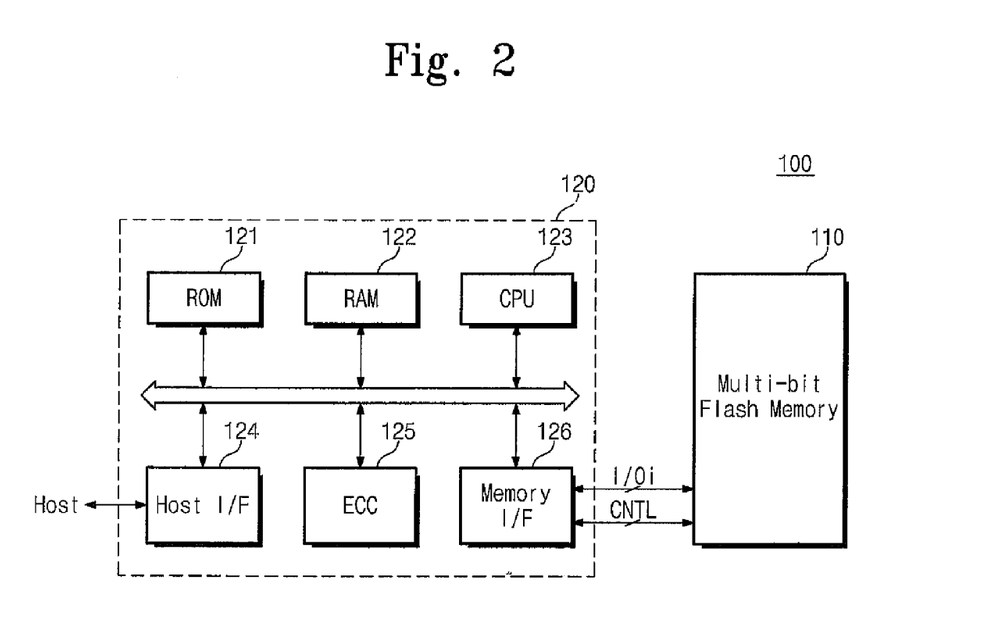
FIG. 2 is a block diagram of a memory system according to an embodiment of the present invention.

FIG. 2 is a block diagram of memory system 100 that controls multi-bit flash memory device 110 to perform an over-sampling read operation. Data outputted from multi-bit flash memory 110 based on the over-sampling read operation includes bit values determined by a soft decision algorithm in a memory controller 120. In particular, multi-bit flash memory device 110 performs an over-sampling read operation or a fractional read operation based on memory controller 120. Memory controller 120 controls the multi-bit flash memory device 110 to perform the over-sampling read operation and the normal read operation. Memory controller 120 utilizes a hard decision algorithm or a soft decision algorithm to read data from the multi-bit flash memory device 100. ROM 21 stores code data for interfacing with a host and stores code data for driving memory controller 120. Upon power-up, the code data is loaded into RAM 122 which is used as an operating memory of processing unit 123. Host interface 124 includes a data exchange protocol of a host connected to memory system 100. Error correcting block 125 detects and corrects an error in data read from multi-bit flash memory device 110. Memory interface 126 interfaces with multi-bit flash memory device 110. Processing unit 123 determines bit values of data by using maximum likelihood operations with reference to data read via a normal read operation and an over-sampling read operation according to the soft decision algorithm. Processing unit 123 operations general controls operations of memory controller 120.

Multi-bit flash memory device 110 performs an over-sampling read operation or a fractional read operation according to control of memory controller 120. The multi-bit flash memory device 110 reads the most significant bit (MSB) data of selected memory cells in response to a command from memory controller 120. Multi-bit flash memory device 110 performs a normal read operation and an over-sampling read operation on memory cells with an MSB of 1. Data latched according to the normal and over-sampling read operations of the memory cells with the MSB of 1 are supplied to memory controller 120 later. Once the latched data of the memory cells with the MSB of 1 are outputted, multi-bit flash memory device 110 performs normal and over-sampling read operations on memory cells with an MSB of 0. At this point, the outputted data of the memory cell with an MSB of 1 are outputted through the normal and oversampling read operations, and their final bit values are determined using a soft decision algorithm of memory controller 120. During the normal and over-sampling read operations of the memory cell with an MSB of 0, a soft decision operation of the memory cells with an MSB of 1 is performed in memory controller 120. That is, the read operation of the multi-bit flash memory device 110 and the decision operation of memory controller 120 proceeds in a pipeline method.

Once the normal and over-sampling read operations of the memory cell with an MSB of 0 are completed, multi-bit flash memory device 110 outputs the latched data to memory controller 120. The outputted normal and over-sampling read data include bit values that are finally determined according to a soft decision algorithm and the data of the memory cells with an MSB of 1 are combined with the data from the memory cells with an MSB of 0. Memory system 100 is configured to determine whether or not to perform an over-sampling read operation. That is, the normal read operation and an over-sampling read operation for the selected memory cells can be continuously performed regardless of the MSB value. In this manner, memory system 100 of the present invention performs an over-sampling read operation on the selected memory cells at high speed according to a pipeline method.

Figure 3A:
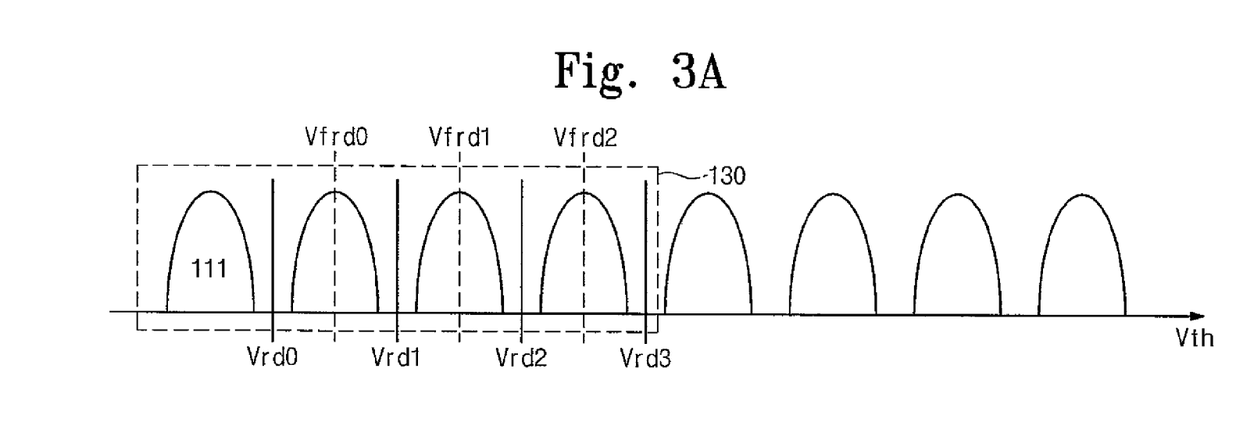
FIGS. 3A and 3B are views according to a first embodiment of the present invention.
Figure 3B:
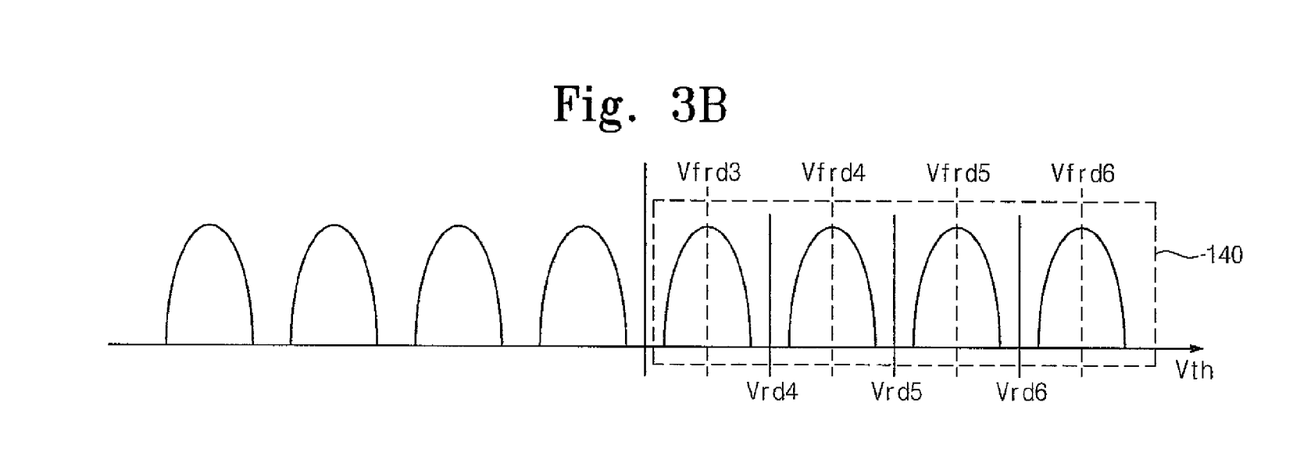

FIGS. 3A and 3B are diagrams illustrating an over-sampling read operation of a pipeline method. FIG. 3A illustrates a first read operation which starts with detecting a bit value of an MSB of the selected memory cells. When read voltage Vrd3 is supplied to a word line of the selected memory cells, the MSB of the selected memory cells are detected by a page buffer (not shown). Memory cells 130 having a detected MSB of 1 are selected during the first read operation. The memory cells are detected according to the normal read operation through respective read voltages Vrd0 to Vrd2 and the detected data are stored in a latch of a page buffer (not shown). After the normal read operation, memory cells 130 with an MSB of 1 are detected according to the over-sampling read voltages Vrfd0 to Vrfd2. The data detected according to the over-sampling read operation and separated from the data detected according to the normal read operation are stored on the latches. Once the normal and over-sampling read operations in the first read operation are completed, the latched normal and over-sampling read data are outputted. The outputted read data of the memory cells 130 with an MSB of 1 are generated as highly-reliable decision data according to a soft decision algorithm.

Referring to FIG. 3B, a second read operation is performed on memory cells 140 with an MSB of 0. Multi-bit data programmed by a normal read operation providing read voltages Vrd4 to Vrd6 to a word line are detected in memory cells 140 with an MSB of 0. Following the normal read operation, memory cells 140 with an MSB of 0 are detected by over-sampling read voltages Vfrd0 to Vfrd2. The data detected according to the over-sampling read operation and separated from the data detected according to the normal read operation are stored on the latches. Once the second read operations are completed, the latched normal and over-sampling read data are outputted. During the interval where the second read operation is performed in the multi-bit flash memory device, memory controller 120 performs a soft decision operation with reference to normal read data and over-sampling read data outputted by the first read operation. Memory controller 120 utilizes a read operation of a pipeline method which performs a soft decision operation on the data outputted during a data detecting operation in the multi-bit flash memory device 110.

Figure 4:
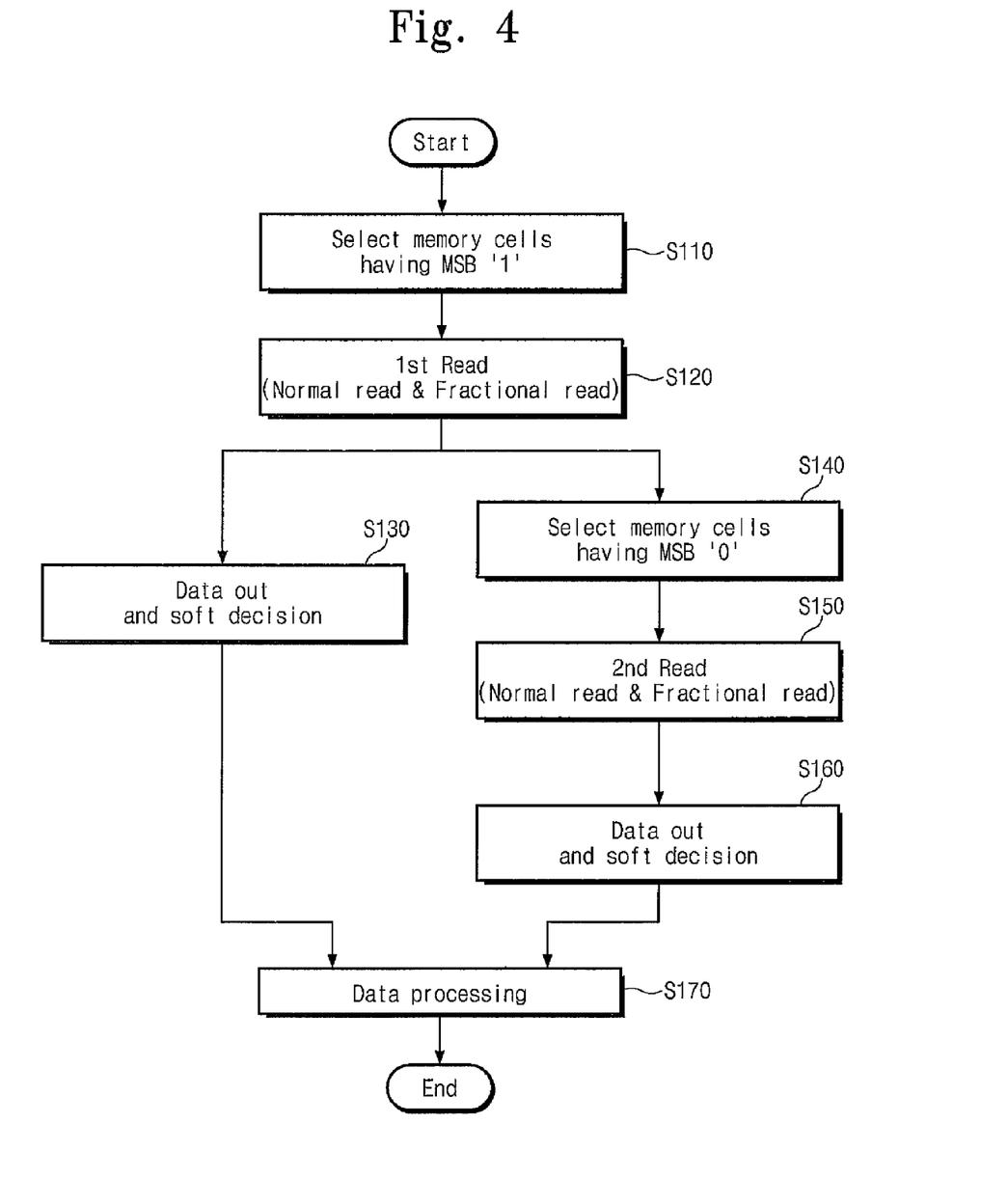
FIG. 4 is a flowchart of a reading method of FIGS. 3A and 3B.

FIG. 4 is a flowchart illustrating a read operation of a pipeline method where memory system 100 performs an over-sampling read operation on the selected memory cells twice according to the pipeline method. That is, a soft decision operation and the second read operation are simultaneously performed on the data outputted by the first read operation. Memory controller 120 outputs a command code to multi-bit flash memory device 110 to perform a pipeline read operation in response to a read request from a host. The multi-bit flash memory device 110 detects the memory cells selected by read voltage Vrd3 in response to the pipeline read command. In step S110, memory cells with an MSB of 1 are selected from among the selected memory cells and the first read operation is performed on the selected memory cells. During the first read operation, the memory cells are detected according to respective read voltages Vrd0 to Vrd2 and the detected data are stored on latches in a page buffer (not shown). Following the normal read operation, the memory cells with an MSB of 1 are detected according to over-sampling read operation voltages Vfrd0 to Vfrd2. The data detected according to the oversampling read operation and separated from the data detected according to the normal read operation are stored on the latches in step S120.

Once the normal and over-sampling read operations in the first read operation are completed, the latched normal and over-sampling read data are outputted. In step S130, the detected data are determined by the soft decision algorithm of memory controller 120 shown in FIG. 2. Separated from the soft decision algorithm of memory controller 120, the second read operation proceeds in the multi-bit flash memory device 110 to select the memory cells 140 of FIG. 3B with an MSB of 0 among the selected memory cells in step S140. During the second read operation, the memory cells with an MSB of 0 are detected according to the respective read voltages Vrd4 to Vrd6. Next, the memory cells with an MSB of 0 are detected according to the over-sampling read voltages Vfrd0 to Vfrd2. In step S150, the data detected according to the over-sampling read operation and separated from the data detected according to the normal read operation are stored on the latches. When the data stored according to the second read operation and latched according to the over-sampling read operation are outputted, a bit value is determined according to a soft decision algorithm in the memory controller 120 at step S160. In step S170, the data read according to the first and second read operations are combined in the memory controller 110, and an error correction operation is performed. Steps S130, S140 and S150 are performed in a pipelined manner.

That is, the soft decision algorithm operation and the second read operation are performed on the data outputted by the first read operation by using a pipeline method. In this manner, the load associated with memory controller 120 which performs the soft decision algorithm on the data read from the selected memory cells can be reduced.

Figure 5A:
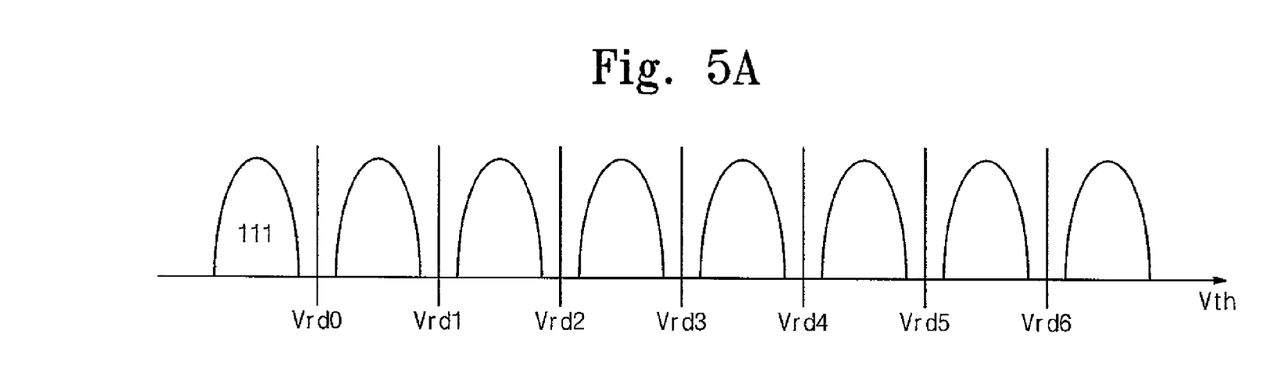
FIGS. 5A and 5B are views according to a second embodiment of the present invention.
Figure 5B:
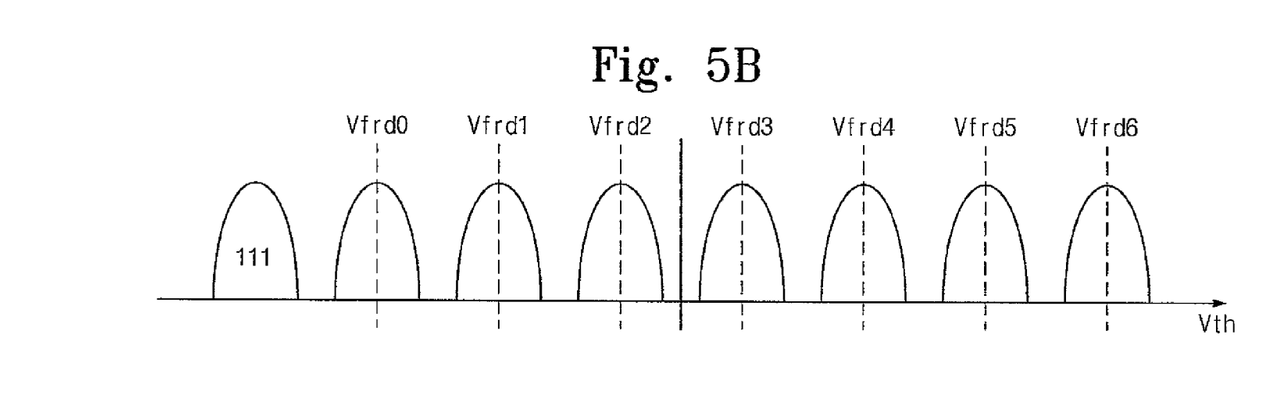

FIGS. 5A and 5B are views illustrating a data reading method of the memory system 100 where multi-bit flash memory device 110 does not distinguish memory cells according to an MSB and performs the normal and over-sampling read operations on all the selected memory cells. FIG. 5A illustrates read voltages Vrd0 to Vrd6 for a normal read operation and FIG. 5B illustrates read voltages Vfrd0 to Vfrd6 for an over-sampling read operation. The memory system o performs only the normal read operation by the read voltages Vrd0 to Vrd6 of FIG. 5A. The memory system may additionally perform the over-sampling read operation of FIG. 5B to achieve more reliable data.

Figure 6:
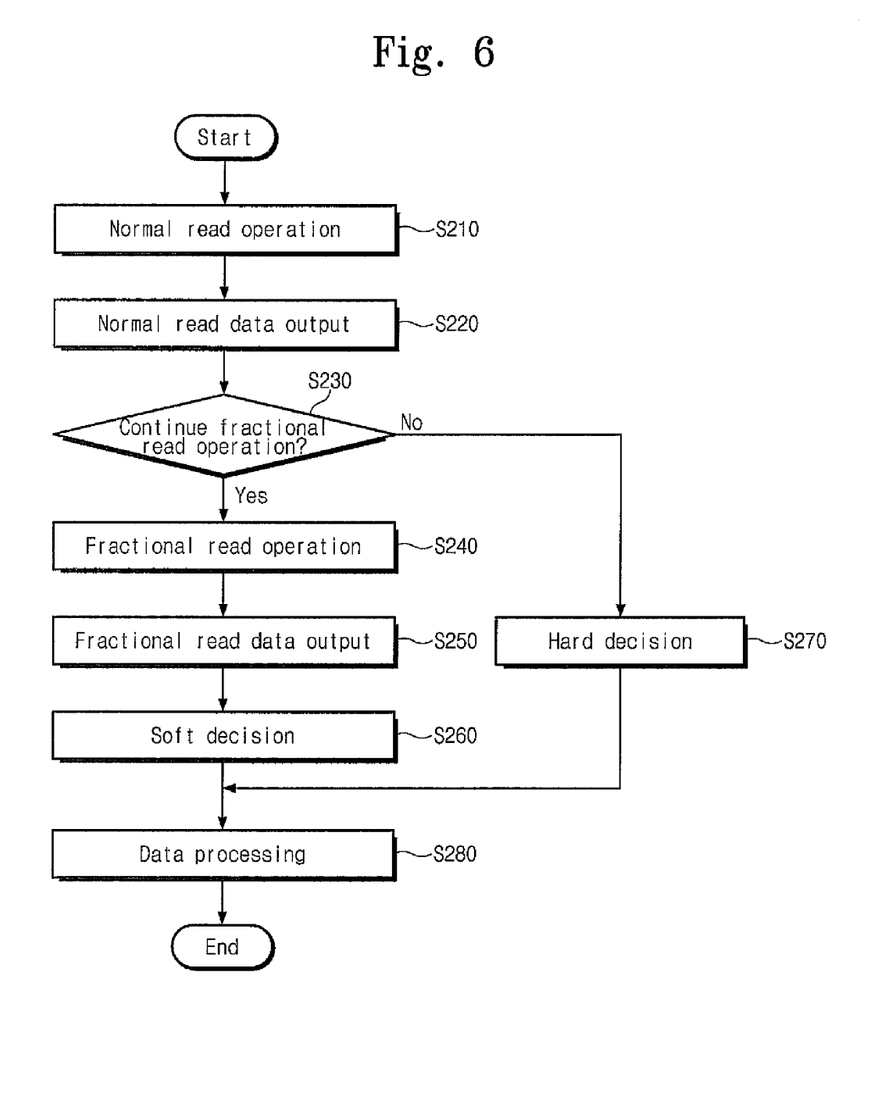
FIG. 6 is a flowchart of a reading method of FIG. 5.

FIG. 6 is a flowchart illustrating an alternative embodiment where the memory system does not divide the selected memory cells according to an MSB, and performs a normal read operation or an over-sampling read operation. In particular, once a read operation proceeds, multi-bit flash memory device 110 performs a normal read operation on selected memory cells. The normal read voltages Vrd0 to Vrd6 are sequentially provided into a word line of the selected memory cells. A page buffer (not shown) detects a bit line of the selected memory cells and stores the detected data (multi-bit data) on a plurality of latches in step S210. Once the normal read operation is completed, the multi-bit flash memory device 110 outputs the detected data in the latches into the memory controller in step S220. Memory controller 120 determines whether or not to perform the over-sampling read operation in step S230. If it is determined not to perform the over-sampling read operation, the data outputted according to the normal read operation are determined as read data without additional processing according to a soft decision algorithm in step S270.

However, when an over-sampling read operation needs to be performed to obtain more reliable data as determined in step S230, the process proceeds to step S240. Multi-bit flash memory device 110 detects memory cells selected by the over-sampling read voltages Vrfd0 to Vfrd6 to perform the over-sampling read operation. The detected data are stored on latches of the page buffer in step S240. Once the over-sampling read operation is completed, over-sampling read data are outputted to memory controller 110 in step S250. In step S260, the memory controller 120 performs a soft decision operation with reference to the outputted over-sampling data and the data outputted during the normal read operation. The data resulting from the soft decision algorithm are processed through an error correction algorithm and supplied to the host in step S280. In this manner, the normal read operation and the over-sampling read operation can be selectively performed on the selected memory cells. For the highly reliable data, the memory controller 120 continuously performs the normal read operation and the over-sampling read operation to determine data values according to the soft decision algorithm. Alternatively, for the data that does not require high reliability, the flash memory device only performs the normal read operation.

Figure 7:
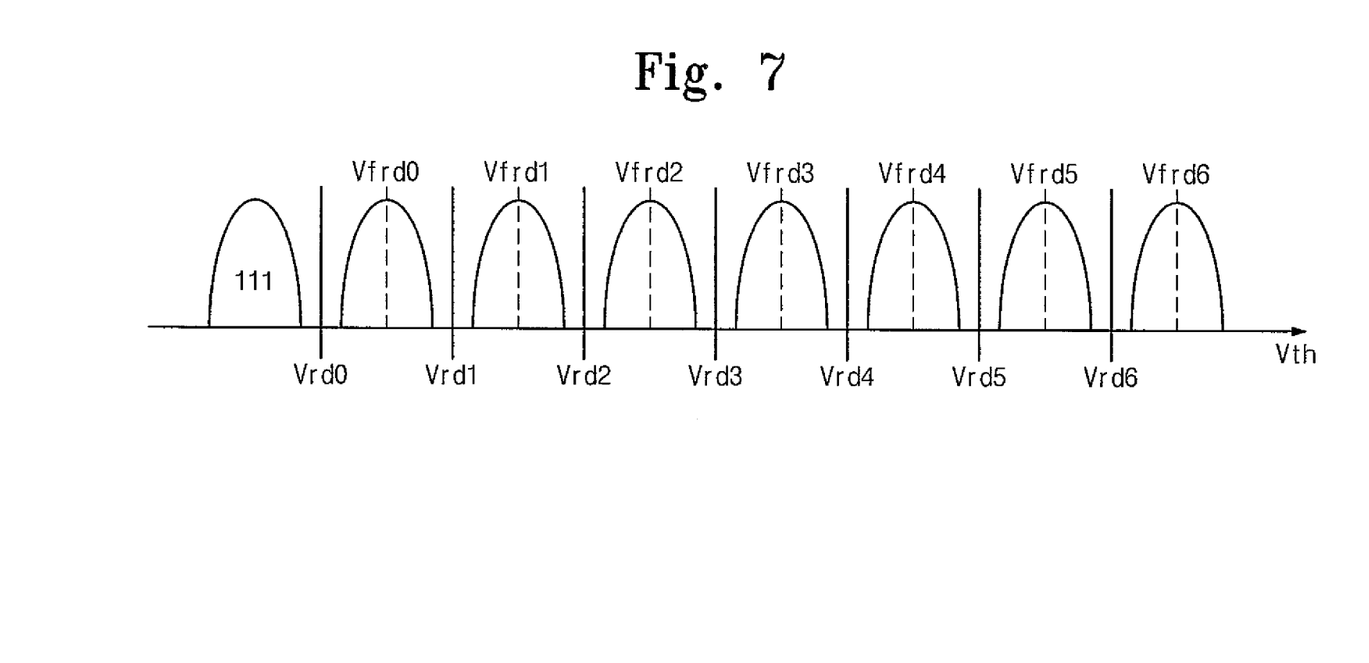
FIG. 7 is a view according to a third embodiment of the present invention.

FIG. 7 is a diagram illustrating the normal read operation and the over-sampling read operation performed during continuous read cycles. The normal read data and the over-sampling read data detected during the continuous read cycles are outputted to memory controller 120. However, during the continuous read cycles, the page buffer must include a sufficient number of latches for storing all the data detected as a result of the over-sampling read operation.

Figure 8:
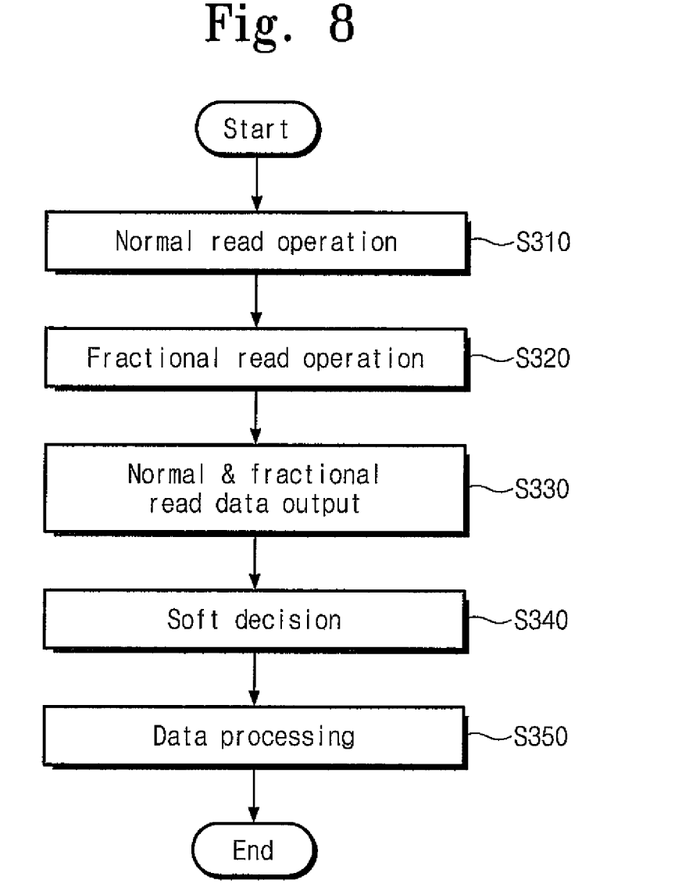
FIG. 8 is a flowchart of a reading method of FIG. 7.

FIG. 8 is a flowchart of a read operation according to a third embodiment of the present invention. Memory controller 120 outputs a command code to multi-bit flash memory device 110 to perform a read operation in response to a read request from a host. Multi-bit flash memory device 110 detects the data associated with the memory cells selected by the read voltages Vrd0 to Vrd6 in response to a read command. In step S310, the normal read data corresponding to the detected data and a plurality of pages are sequentially stored on latches of a page buffer. Multi-bit flash memory device 110 sequentially detects memory cells selected according to the over-sampling read voltages Vfrd0 to Vrfd2. In step S320, the detected over-sampling data are stored on latches that are separated from the latches storing the data detected during the normal read operation. Once the over-sampling read operation is completed, the data in a page buffer according to the normal read operation and the over-sampling read operation are outputted to memory controller 110 in step S330. The outputted data includes bit values that are finally determined according to a soft decision algorithm in step S340. In step S350, a data processing operation is performed to deliver the data to the host. In this manner, the normal read operation and the over-sampling read operation are performed during continuous read cycles. Accordingly, a latch structure of a page buffer is required to latch all the data detected according to the normal read operation and the over-sampling read operation.

According to a reading method of the multi-bit flash memory device, it is possible to output data, detected according to an over-sampling read operation, at high speed which results in a high speed and reliable memory system. Although the present invention has been described in connection with the embodiments of the present invention illustrated in the accompanying drawings, it is not limited thereto. It will be apparent to those skilled in the art that various substitutions, modifications and changes may be made thereto without departing from the scope and spirit of the invention.

What is claimed is:

1. A read method of a non-volatile memory device including a plurality of memory cells programmed in a first state or a second state, the method comprising:
    detecting the plurality of memory cells via a first read voltage for distinguishing a threshold voltage of the plurality of memory cells between the first state and the second state;
    outputting first data being detected from the plurality of memory cells via the first read voltage;
    determining whether or not to perform an over-sampling read operation based on the first data;
    performing the over-sampling read operation to detect the plurality of memory cells via a second read voltage, wherein the second read voltage is disposed between the first read voltage and a threshold voltage corresponding to a peak point of the first state or the second state;
    outputting second data detected through the over-sampling read operation; and
    determining read data through a soft decision algorithm based on the first and second data.

2. The method as set forth in claim 1, wherein the first and second states are two adjacent data states.

3. The method as set forth in claim 1, wherein the first read voltage is predetermined voltage to distinguish the first state from the second state.

4. The method as set forth in claim 1, wherein the first data and the second data are transmitted in a page unit.

5. The method as set forth in claim 1, when the over-sampling read operation is not selected, the first data is output in a hard decision manner.

6. A memory system comprising:
    a non-volatile memory device performing a normal read operation so as to output a first data and an over-sampling read operation so as to output a second data on a plurality of memory cells which are programmed in a first state or a second state; and
    a memory controller communicating with the non-volatile memory device and configured to control the non-volatile memory device to selectively perform the over-sampling read operation during a read operation, wherein the memory controller determines read data through a soft decision algorithm based on the first data and the second data when the over-sampling read operation is selected,
    wherein during the normal read operation, the plurality of memory cells are detected via a first read voltage,
    wherein during the over-sampling read operation, the plurality of memory cells are detected via a second read voltage which is disposed between the first read voltage and a threshold voltage corresponding to the peak point of the first state or the second state.

7. The memory system of claim 6, wherein each of the first and second data correspond to a page unit size.

8. The memory system of claim 6, wherein the first data is determined as the read data in a hard decision manner when the over-sampling read operation is not selected.

9. The memory system of claim 6, wherein the first read voltage is predetermined voltage to distinguish the first state from the second state.

10. A method for reading a non-volatile memory device, the method comprising:
    performing a normal read operation on a plurality of memory cells via a first read voltage for distinguishing each of threshold voltages of the plurality of memory cells between a first state and a second state;
    performing an over-sampling read operation on the plurality of memory cells via a second read voltage being disposed between the first read voltage and a threshold voltage corresponding to the peak point of the first state or the second state; and
    performing a soft decision operation referring to a first read data derived from the normal read operation and a second read data derived from the over-sampling read operation.

11. The method as set forth in claim 10, wherein the first and second states are adjacent program states among a plurality of program states.

12. The method as set forth in claim 10, further comprising:
    latching the first read data in the non-volatile memory device;
    latching the second read data in the non-volatile memory device; and
    outputting the first read data and the second read data to an external of the non-volatile memory device.

13. The method as set forth in claim 12, wherein the outputting the first and second read data is performed after the over-sampling read operation.

14. The method as set forth in claim 10, wherein each of the first read data and second read data correspond to a page unit size.

15. A read method of a non-volatile memory device, the method comprising:
    performing a first normal read operation and a first over-sampling read operation on a first plurality of memory cells;

outputting a first data derived from the first normal read operation in page unit and a second data derived from the first over-sampling read operation in page unit;

performing a first soft decision operation referring to the first data and the second data read from the first plurality of memory cells;

during the first soft decision operation, performing a second normal read operation and a second over-sampling read operation on a second plurality of memory cells.

16. The method as set forth in claim 15, further comprising:

selecting the second plurality of memory cells during the first soft decision operation.

* * * * *